US012740126B2

(12) United States Patent
Cho et al.

(10) Patent No.: US 12,740,126 B2
(45) Date of Patent: Sep. 15, 2026

(54) POWER SEMICONDUCTOR DEVICE AND METHOD OF MANUFACTURING SAME

(71) Applicant: DB HiTek Co., Ltd., Bucheon-si (KR)

(72) Inventors: Min Su Cho, Eumseong-gun (KR); Dae Il Kim, Eumseong-gun (KR); Ji Houn Jung, Eumseong-gun (KR); Hee Sub Lee, Eumseong-gun (KR); Ung Bi Son, Eumseong-gun (KR); Jun Hyeok Lee, Eumseong-gun (KR)

(73) Assignee: DB HiTek Co., Ltd., Bucheon-si (KR)

( * ) Notice: Subject to any disclaimer, the term of this patent is extended or adjusted under 35 U.S.C. 154(b) by 332 days.

(21) Appl. No.: 18/635,711

(22) Filed: Apr. 15, 2024

(65) Prior Publication Data

US 2025/0280586 A1 Sep. 4, 2025

(30) Foreign Application Priority Data

Mar. 4, 2024 (KR) ........................ 10-2024-0030653

(51) Int. Cl.

| | |
|---|---|
| ***H01L 29/417*** | (2006.01) |
| ***H01L 29/20*** | (2006.01) |
| ***H01L 29/40*** | (2006.01) |
| ***H01L 29/66*** | (2006.01) |
| ***H01L 29/778*** | (2006.01) |
| ***H10D 30/01*** | (2025.01) |
| ***H10D 30/47*** | (2025.01) |
| ***H10D 62/85*** | (2025.01) |
| ***H10D 64/00*** | (2025.01) |
| ***H10D 64/01*** | (2025.01) |
| ***H10D 64/23*** | (2025.01) |

(52) U.S. Cl.

CPC ......... *H10D 64/256* (2025.01); *H10D 30/015* (2025.01); *H10D 30/475* (2025.01); *H10D 62/8503* (2025.01); *H10D 64/01* (2025.01); *H10D 64/112* (2025.01)

(58) Field of Classification Search

CPC .. H10D 64/256; H10D 30/015; H10D 30/475; H10D 62/8503; H10D 64/01; H10D 64/112; H10D 62/343; H10D 30/4755; H10D 62/105

USPC .......................................................... 257/194

See application file for complete search history.

(56) References Cited

U.S. PATENT DOCUMENTS

2005/0253168 A1* 11/2005 Wu ...................... H10D 64/112 257/E29.253
2020/0105917 A1* 4/2020 Okita ................. H10D 30/4755
2022/0052166 A1* 2/2022 Yeh ...................... H10D 30/475
2023/0231045 A1 7/2023 Yamada et al.

FOREIGN PATENT DOCUMENTS

KR 10-2020-0068745 A 6/2020
WO WO-2025063660 A1 * 3/2025

* cited by examiner

*Primary Examiner* — Tong-Ho Kim

(74) *Attorney, Agent, or Firm* — Bridgeway IP Law Group, PLLC; Jihun Kim

(57) ABSTRACT

Proposed are a power semiconductor device and a method of manufacturing the same seeking to increase a current path area and to capture electrons trapped between a gate electrode and a drain electrode to prevent current collapse effects by forming a plurality of hole injection regions spaced apart from each other at the bottom of the drain electrode.

17 Claims, 10 Drawing Sheets

POWER SEMICONDUCTOR DEVICE AND METHOD OF MANUFACTURING SAME

CROSS REFERENCE TO RELATED APPLICATION

The present application claims priority to Korean Patent Application No. 10-2024-0030653, filed Mar. 4, 2024, the entire contents of which is incorporated herein for all purposes by this reference.

BACKGROUND OF THE INVENTION

Field of the Invention

The present disclosure relates to a power semiconductor device and a method of manufacturing the same and, more particularly, to a power semiconductor device and a method of manufacturing the same seeking to increase a current path area and to capture electrons trapped between a gate electrode and a drain electrode to prevent current collapse effects by forming a plurality of hole injection regions spaced apart from each other at the bottom of the drain electrode.

Description of the Related Art

Nitride semiconductors are being applied to high-voltage and high-power semiconductor devices due to their high electron saturation velocity and wide-bandgap (WBG) properties. In particular, gallium nitride (GaN) has wider band gap and higher breakdown electric field properties compared to silicon and gallium arsenide (GaAs), and thus shows excellent breakdown voltage characteristics when applied to transistors.

In addition, since gallium nitride (GaN)-based devices have higher electron mobility and electron saturation velocity compared to silicon-based devices that are currently commonly used, they may exhibit high frequency characteristics. When applied to a GaN device, the high electron mobility leads to improved on-resistance characteristics, and thus allows for the implementation of a low-loss switching device.

As such, GaN-based field effect transistors (FETs) have great advantages as devices that are suitable for high frequency and high power applications, and for this reason, continuous research is being conducted thereon. Although much progress has been made in the research and development of GaN-based FETs over the past few years, there are still several issues that need to be addressed regarding device reliability. One of the important issues is related to current collapse effects caused by traps existing in semiconductors.

FIG. 1 is a partial cross-sectional view of a conventional power semiconductor device.

Hereinafter, the schematic structure and problems of a conventional power semiconductor device 9 will be described in detail with reference to the accompanying drawings.

Referring to FIG. 1, in the conventional power semiconductor device 9, a higher voltage than the voltage applied to a source electrode 910 and a gate electrode 930 may be applied to a drain electrode 950. In this case, carriers may be trapped between the gate electrode 930 and the drain electrode 950. Due to the carrier trapping, a current collapse phenomenon occurs, and this current collapse may cause a "memory effect" in which conduction current of a device may vary depending on how long a previously applied voltage has been present. For example, during transistor operation, electrons are trapped in an epitaxial layer or a dielectric layer, and at this time, the trapped electrons may repel electrons traveling through a channel, impeding current conduction through a two-dimensional electron gas (2DEG) layer 970. This may immediately cause a problem of increasing the resistance of the channel.

To solve the above-mentioned problems, the present disclosure proposes a novel power semiconductor device with improved structure and a method of manufacturing the same.

DOCUMENTS OF RELATED ART (Patent Document 0001) Korean Patent Application Publication No. 10-2020-0068745 "HIGH ELECTRON MOBILITY TRANSISTOR"

SUMMARY OF THE INVENTION

The present disclosure has been made to solve the problems of the related art, and an objective of the present disclosure is to provide a power semiconductor device and a method of manufacturing the same seeking to capture electrons trapped between a gate electrode and a drain electrode to prevent current collapse effects by forming a plurality of hole injection regions spaced apart from each other at the bottom of the drain electrode.

An objective of the present disclosure is to provide a power semiconductor device and a manufacturing method thereof seeking to increase the total area of a current path by increasing a junction area between GaN of a channel layer and a metal layer such as Ti of a drain electrode by forming a plurality of protruding regions that protrude downward on the lower side of the drain electrode to be spaced apart.

An objective of the present disclosure is to provide a power semiconductor device and a manufacturing method thereof seeking to ensure process uniformity by etching a barrier layer and a channel layer located in the space between hole injection regions.

An objective of the present disclosure is to provide a power semiconductor device and a manufacturing method thereof seeking to reduce an electric field between a gate electrode and a drain electrode by forming a first field plate and/or a second field plate on the side spaced apart from the gate electrode.

An objective of the present disclosure is to provide a power semiconductor device and a manufacturing method thereof seeking to reduce an electric field between a gate electrode and a drain electrode by having the drain electrode form a wing portion.

The present disclosure may be implemented by an embodiment having the following configuration to achieve the above-described objectives.

According to an embodiment of the present disclosure, there is provided a power semiconductor device, including: a substrate; a channel layer having a first nitride-based semiconductor layer and disposed on the substrate; a barrier layer disposed on the channel layer and having a second nitride-based semiconductor layer that is different from the first nitride-based semiconductor layer of the channel layer; a capping layer having an impurity doped region of a first conductivity type and disposed on the barrier layer; a gate electrode disposed on the capping layer; a plurality of hole injection regions, each having an impurity doped region of a first conductivity type, each being laterally spaced apart from another on the barrier layer; and a drain electrode in contact with the plurality of hole injection regions.

According to another embodiment of the present disclosure, in the power semiconductor device, the drain electrode may include a plurality of protruding regions, each being disposed at a bottom of the drain electrode in a space between the plurality of hole injection regions.

According to still another embodiment of the present disclosure, in the power semiconductor device, the plurality of protruding regions may have bottoms thereof extending into the channel layer.

According to still another embodiment of the present disclosure, in the power semiconductor device, an upper surface of the channel layer below each of the plurality of hole injection regions may be disposed at a higher position than an upper surface of the channel layer below each of the plurality of protruding regions.

According to still another embodiment of the present disclosure, in the power semiconductor device, the capping layer may have a greater top to bottom thickness compared to a top to bottom thickness of each of the plurality of hole injection regions.

According to still another embodiment of the present disclosure, in the power semiconductor device, the plurality of hole injection regions may be spaced apart from each other in an island pattern.

According to still another embodiment of the present disclosure, in the power semiconductor device, the plurality of hole injection regions may be laterally spaced from each other in a stripe pattern.

According to still another embodiment of the present disclosure, in the power semiconductor device, the drain electrode may further include a wing portion that protrudes a predetermined length from a predetermined height of the drain electrode toward a side adjacent to the gate electrode.

According to still another embodiment of the present disclosure, the power semiconductor device may further include: an insulating film covering the gate electrode and the drain electrode; and a first field plate disposed apart from the gate electrode within the insulating film, wherein the first field plate may be electrically connected to the gate electrode.

According to still another embodiment of the present disclosure, the power semiconductor device may further include: a source electrode disposed apart from the gate electrode; and a second field plate disposed apart from the gate electrode within an insulating film, wherein the second field plate may be electrically connected to the source electrode.

According to still another embodiment of the present disclosure, there is provided a power semiconductor device, including: a substrate; a channel layer having a first nitride-based semiconductor layer and disposed on the substrate; a barrier layer disposed on the channel layer and having a second nitride-based semiconductor layer that is different from the first nitride-based semiconductor layer of the channel layer; a capping layer having an impurity doped region of a first conductivity type and disposed on the barrier layer; a gate electrode disposed on the capping layer; a plurality of hole injection regions, each having an impurity doped region of a first conductivity type and laterally disposed apart from another on the barrier layer; a source electrode disposed apart from the gate electrode; and a drain electrode disposed apart from the gate electrode and including a plurality of protruding regions, each being disposed in a space between the plurality of hole injection regions.

According to still another embodiment of the present disclosure, in the power semiconductor device, the capping layer may have a thickness that is substantially the same as a thickness of each of the plurality of hole injection regions.

According to still another embodiment of the present disclosure, the power semiconductor device may further include: an insulating film covering the gate electrode, the source electrode, and the drain electrode; a first field plate disposed apart from the gate electrode within the insulating film; and a second field plate disposed apart from the first field plate within the insulating film, wherein the first field plate may be electrically connected to the gate electrode and the second field plate may be electrically connected to the source electrode.

According to still another embodiment of the present disclosure, in the power semiconductor device, each of the plurality of protruding regions may have a longer vertical length than a vertical length of each of the plurality of hole injection regions adjacent thereto.

According to an embodiment of the present disclosure, there is provided a method of manufacturing a power semiconductor device, the method including: forming a channel layer having a first nitride-based semiconductor layer on a substrate; forming a barrier layer having a second nitride-based semiconductor layer that is different from the first nitride-based semiconductor layer on the channel layer; forming a capping layer of a first conductivity type on the barrier layer; forming a plurality of hole injection regions on the barrier layer apart from the capping layer; forming a first insulating film layer on the barrier layer to cover the capping layer and the plurality of hole injection regions; and forming a source electrode and a drain electrode after etching the first insulating film layer.

According to another embodiment of the present disclosure, in the method of manufacturing a power semiconductor device, the plurality of hole injection regions may be provided to be spaced apart from each other by forming a first doped layer on the barrier layer and then etching the first doped layer using a mask pattern.

According to still another embodiment of the present disclosure, in the method of manufacturing a power semiconductor device, the drain electrode may be provided by forming a plurality of trenches by etching the barrier layer and the channel layer beneath a plurality of spaces separating the plurality of hole injection regions from each other, forming a doped layer of a first conductivity type to cover the plurality of hole injection regions and fill the plurality of trenches, and etching the doped layer.

According to still another embodiment of the present disclosure, in the method of manufacturing a power semiconductor device, each of the plurality of hole injection regions may have a lesser thickness than a thickness of the capping layer.

According to still another embodiment of the present disclosure, the method of manufacturing a power semiconductor device may further include: forming a gate electrode on the capping layer; forming a first field plate apart from the gate electrode; and forming a second field plate above and apart from the first field plate.

The present disclosure has the following effects by the above configurations.

According to the present disclosure, by forming a plurality of hole injection regions spaced apart from each other at the bottom of a drain electrode, it is possible to capture electrons trapped between a gate electrode and the drain electrode to prevent current collapse effects.

In addition, according to the present disclosure, by forming a plurality of protruding regions that protrude downward on the lower side of a drain electrode to be spaced apart, it is possible to increase the total area of a current path by increasing a junction area between GaN of a channel layer and a metal layer such as Ti of a drain electrode.

In addition, according to the present disclosure, by etching a barrier layer and a channel layer located in the space between hole injection regions, it is possible to ensure process uniformity.

In addition, according to the present disclosure, by forming a first field plate and/or a second field plate on the side spaced apart from a gate electrode, it is possible to reduce an electric field between the gate electrode and a drain electrode.

Furthermore, according to the present disclosure, by having a drain electrode form a wing portion, it is possible to reduce an electric field between a gate electrode and the drain electrode.

Meanwhile, it should be added that even if effects are not explicitly mentioned herein, the effects described in the following specification expected by the technical features of the present disclosure and their potential effects are treated as if they were described in the specification of the present disclosure.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Hereinafter, embodiments of the present disclosure will be described in more detail with reference to the accompanying drawings. The embodiments of the present disclosure may be modified in various forms, and the scope of the present disclosure should not be construed as being limited to the following embodiments, but should be construed based on the matters described in the claims. In addition, these embodiments are only provided for reference in order to more completely explain the present disclosure to those of ordinary skill in the art.

As used herein, the singular form may include the plural form unless the context clearly indicates otherwise. In addition, as used herein, "comprise" and/or "comprising" specify the presence of the recited shapes, numbers, steps, operations, members, elements, and/or groups thereof, but do not exclude the presence or addition of one or more other shapes, numbers, steps, operations, members, elements, and/or groups thereof.

Hereinafter, it should be noted that when one component (or layer) is described as being disposed on another component (or layer), one component may be disposed directly on another component, or another component(s) or layer(s) may be located between the components. In addition, when one component is expressed as being directly disposed on or above another component, no other component(s) are located between the components. Moreover, being located on "top", "upper", "lower", "top", "bottom" or "one (first) side" or "side" of a component means a relative positional relationship.

Terms such as first, second, etc. may be used to describe various items such as various elements, areas and/or parts, but the items are not limited by these terms.

In addition, it should be noted that, where certain embodiments are otherwise feasible, certain process sequences may be performed other than those described below. For example, two processes described in succession may be performed substantially simultaneously or in the reverse order.

Furthermore, the conductivity type or doped region of the components may be defined as "p-type" or "n-type" according to the main carrier characteristics, but this is only for convenience of description, and the technical spirit of the present disclosure is not limited to what is illustrated. For example, hereinafter, "p-type" or "n-type" will be used as more general terms "first conductivity type" or "second conductivity type", and here, the first conductivity type means p-type, and the second conductivity type means n-type.

Figure 2:
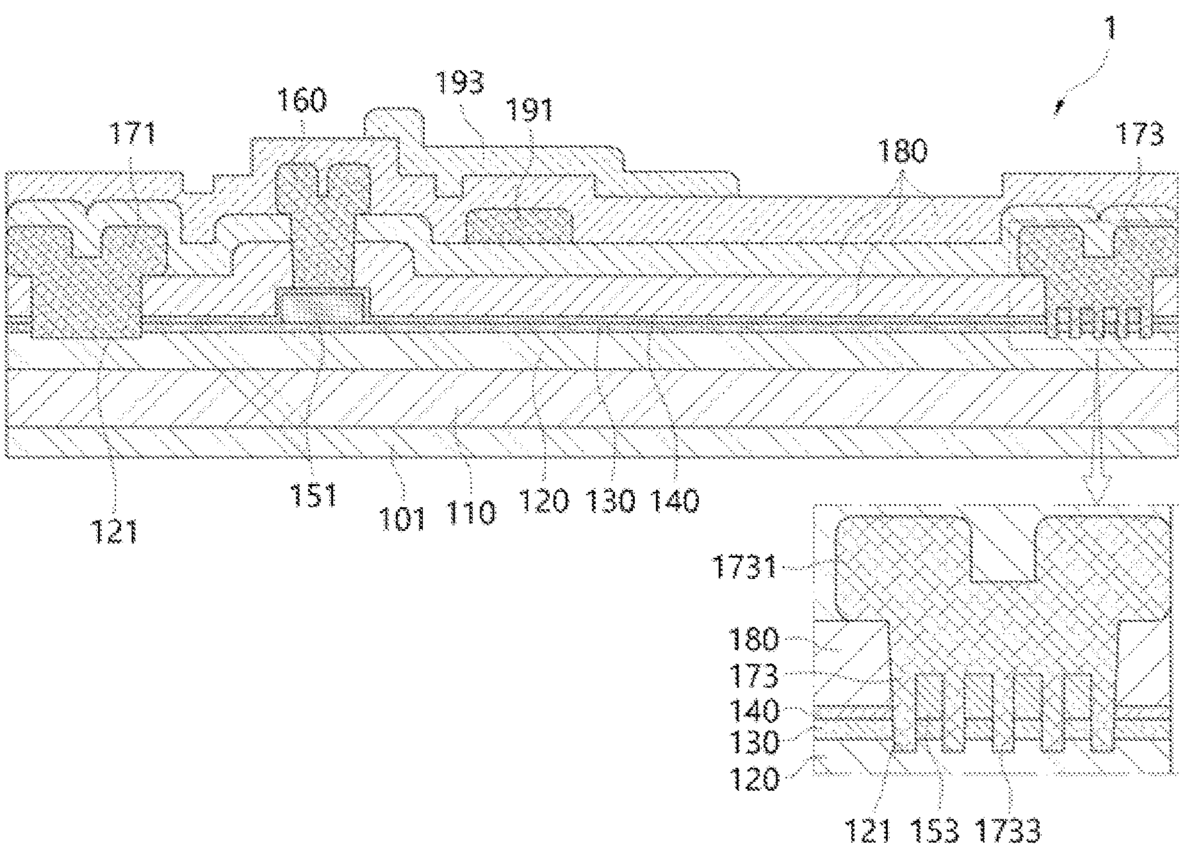
FIG. 2 is a cross-sectional view of a power semiconductor device according to an embodiment of the present disclosure.

FIG. 2 is a cross-sectional view of a power semiconductor device according to an embodiment of the present disclosure.

Hereinafter, a power semiconductor device 1 according to an embodiment of the present disclosure will be described in detail with reference to the accompanying drawings. The above "power semiconductor device 1" is understood to be a nitride-based power semiconductor device.

Referring to FIG. 2, the present disclosure relates to a power semiconductor device 1 and, more particularly, to a power semiconductor device 1 seeking to increase a current path area and to capture electrons trapped between a gate electrode and a drain electrode to prevent current collapse effects by forming a plurality of hole injection regions spaced apart from each other at the bottom of the drain electrode.

First, a substrate 101 may be formed in the power semiconductor device 1 according to an embodiment of the present disclosure. The substrate 101 is a substrate for growth, and may be, for example, a silicon substrate, but is not limited thereto, and may be, for example, a sapphire substrate, a GaN substrate, or a SiC substrate. In the present disclosure, it will be described as an example that the substrate 101 is a silicon substrate.

A buffer layer 110 may be formed on the substrate 101. The buffer layer 110 may be formed, for example, by growing AlN to a predetermined thickness on the substrate 101. Alternatively, the buffer layer 110 may be a form in which one or more composite layers of GaN and AlGaN are grown, but is not limited thereto. The buffer layer 110 may have a structure for preventing stress caused by a difference in lattice constants and thermal expansion coefficients between the substrate 101 and a channel layer 120 to be described later. The buffer layer 110 may be doped with impurities such as C and/or Fe.

The channel layer 120 is formed on the substrate 101, more preferably on the buffer layer 110, and may include, for example, a nitride-based semiconductor layer such as GaN. A two-dimensional electron gas (2DEG) layer (not shown) may be formed on the side adjacent the interface between the channel layer 120 and the barrier layer 130, which will described later, and the 2DEG layer may be formed within the channel layer 120.

The barrier layer 130 may be formed on the channel layer 120. The barrier layer 130 is, for example, a nitride-based semiconductor layer such as AlGaN, and is preferably a nitride-based semiconductor layer that is different from the channel layer 120. The density and mobility of the 2DEG layer may be controlled by adjusting the Al and Ga contents of the barrier layer 130.

A passivation layer 140 may be formed on the barrier layer 130. The passivation layer 140 may be, for example, an Al2O3 layer or a SiN layer, but there is no particular limitation thereon. In addition, it should be noted that the passivation layer 140 may be formed on the barrier layer 130 and to cover a capping layer 151, which will be described later, but is not an essential component of the present disclosure.

The capping layer 151 may be formed on the barrier layer 130. The capping layer 151 is formed on the barrier layer 130 and below a gate electrode 160, and in some cases, may be covered by the passivation layer 140 under the gate electrode 160. The capping layer 151 is, for example, an impurity doped region of the first conductivity type and preferably has positive polarity. When the capping layer 151 is formed to a predetermined thickness or more, the distance from the gate electrode 160 to the 2DEG layer becomes longer, which may reduce the response speed. On the contrary, when the capping layer 151 is formed to a predetermined thickness or less, it is difficult to achieve a normally-off operation. Thus, it is desirable that the capping layer 151 is formed to an appropriate thickness. As an example, the capping layer 151 may be formed by growing p-GaN, for example, by doping Mg into GaN, but the scope of the present disclosure is not limited thereto.

The capping layer 151 is formed at the bottom of the gate electrode 160, so that the 2DEG layer does not exist under the capping layer 151 during non-operation. Thus, since the 2DEG layer does not exist in the channel layer 120 when the gate voltage is off, the device operates in a normally-off fashion, and when the gate voltage is turned on, the 2DEG layer is formed and the device is driven. In addition, the capping layer 151 may be deposited on the barrier layer 130 in the same process as a hole injection region 153, and a detailed description thereof will be provided later.

The gate electrode 160 may be formed on the barrier layer 130. The gate electrode 160 is formed on the barrier layer 130, for example, on the capping layer 151, and may be formed of a single layer or a composite layer of various arbitrary metals such as Al, Ti, Pd, etc. In addition, the gate electrode 160 operates normally off, and a depletion layer of the gate electrode 160 passes through the barrier layer 130 to reach the channel layer 120 and blocks the 2DEG layer.

A source electrode 171 and a drain electrode 173 may be formed spaced apart from the gate electrode 160. The source electrode 171 and the drain electrode 173 are ohmic contact regions formed on the barrier layer 130. It should be noted that the source electrode 171 and the drain electrode 173 may be formed in, for example, a stepped cross-sectional shape or a rectangular cross-sectional shape, but may be formed in various other structures. As an example, the source electrode 171 and the drain electrode 173 may be formed in a structure in which at least one side thereof is stepped along the horizontal direction, and the same applies to the gate electrode 160. The source electrode 171, the gate electrode 160, and the drain electrode 173 may be sequentially spaced apart from each other along the horizontal direction. In addition, the source electrode 171 and the drain electrode 173 may be made of, for example, a single layer or a composite layer of various arbitrary metals capable of ohmic contact, such as Ti, Au, and Al, and there is no particular limitation thereon.

At this time, the drain electrode 173 may include a wing portion 1731 that protrudes by a predetermined length to a side adjacent to the gate electrode 160 along the lateral direction at a predetermined height. That is, the wing portion 1731 extends laterally from a predetermined height of the drain electrode 173 toward the gate electrode 160, and an insulating film 180 may be formed under the wing portion 1731. The wing portion 1731 may function as a drain field plate to reduce an electric field between the gate electrode 160 and the drain electrode 173.

In addition, the lower ends of the source electrode 171 and/or the drain electrode 173 may be located on the barrier layer 130 or may be located directly above the channel layer 120. For example, when the source electrode 171 and/or the drain electrode 173 are located directly above the channel layer 120, the barrier layer 130 on the side where the lower ends of the source electrode 171 and/or the drain electrode 173 will be formed is removed, and the channel layer 120 immediately below the barrier layer 130 may also be partially removed. That is, the channel layer 120 may have a recess region 121.

In an embodiment of the present disclosure, one or more protruding regions 1733 may be formed laterally at the bottom of the drain electrode 173, preferably spaced apart from each other to form a plurality of protruding regions 1733. The protruding region 1733 may have a structure that protrudes downward from the bottom of the drain electrode 173. The hole injection region 153 and the channel layer 120 may be positioned from top to bottom on one side where the protruding region 1733 makes contact. In addition, the hole injection region 153, the barrier layer 130, and the channel layer 120 on the side where the protruding region 1733 is formed may be removed. In this case, the height of the channel layer 120 immediately below the protruding region 1733 is lower than that of the channel layer 120 on the side where the protruding region 1733 is not formed. That is, the recess region 121 may be formed.

In this way, when the drain electrode 173 has multiple protruding regions 1733, a junction area between GaN of the channel layer 120 and a metal layer such as Ti of the drain electrode 173 may be increased compared to a conventional structure, which may increase the overall current path area of the semiconductor device 1.

The insulating film 180 may be formed to cover the gate electrode 160, the source electrode 171, and the drain electrode 173. The insulating film 180 may be formed as a multilayer structure and may have a structure including an oxide film, a nitride film, or both an oxide film and a nitride film, but there is no particular limitation thereon.

In addition, a first field plate 191 and a second field plate 193 may be formed within or on the insulating film 180 on a side spaced apart from the gate electrode 160. As an example, the first field plate 191 may be formed between the gate electrode 160 and the drain electrode 173, and the second field plate 193 may be formed above the first field plate 191 and spaced apart from the first field plate 191, but there is no particular limitation thereon. The first field plate 191 is a layer containing a conductive material and may be electrically connected to the gate electrode 160. The second field plate 193 is also a layer containing a conductive material and may be electrically connected to the source electrode 171. Both the first field plate 191 and the second field plate 193 may perform the function of reducing the electric field between the gate electrode 160 and the drain electrode 173, but it should be noted that the first field plate 191 and the second field plate 193 are not essential components of the present disclosure.

As previously described, the hole injection region 153 may be formed on the side that contacts at least one side of the adjacent protruding region 1733 of the drain electrode 173. A plurality of hole injection regions 153 may be formed to be spaced apart from each other along the lateral direction. The hole injection regions 153, like the capping layer 151, may be formed by growing p-GaN. That is, the hole injection regions 153 may include the same material as the capping layer 151, but the scope of the present disclosure is not limited thereto.

Below, before explaining the features of the present disclosure, the problems of a conventional power semiconductor device 9 will be described in detail.

Figure 1:
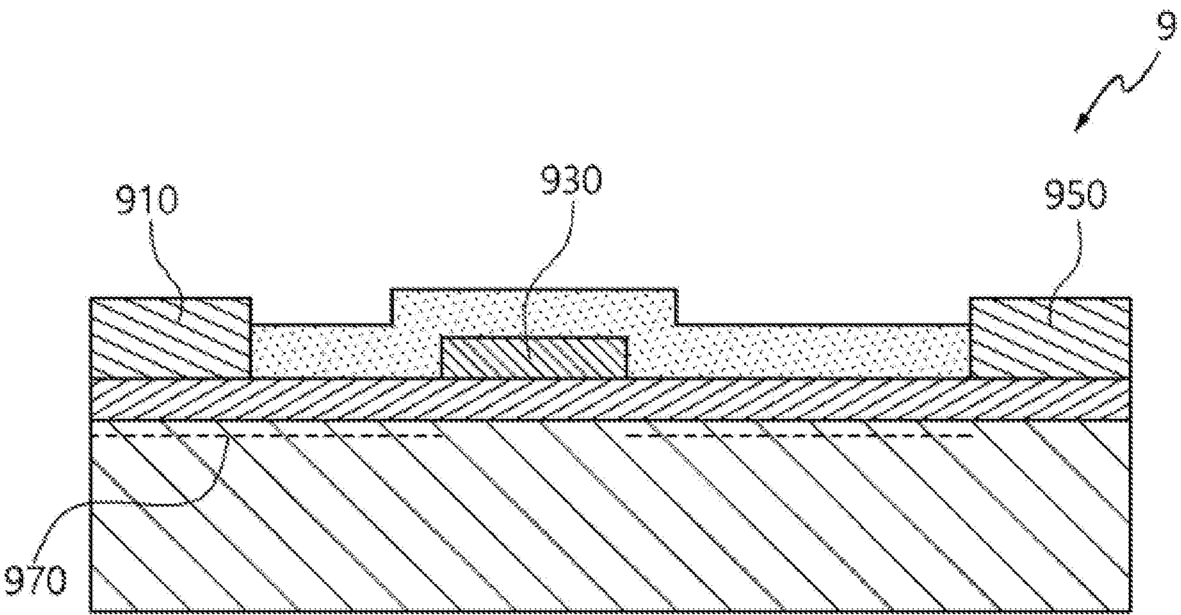
FIG. 1 is a cross-sectional view of a conventional nitride-based power semiconductor device.

Referring to FIG. 1, in the conventional power semiconductor device 9, a higher voltage than the voltage applied to a source electrode 910 and a gate electrode 930 may be applied to a drain electrode 950. In this case, carriers may be trapped between the gate electrode 930 and the drain electrode 950. Due to the carrier trapping, a current collapse phenomenon occurs, and this current collapse may cause a "memory effect" in which conduction current of a device may vary depending on how long a previously applied voltage has been present. For example, during transistor operation, electrons are trapped in an epitaxial layer or a dielectric layer, and at this time, the trapped electrons may repel electrons traveling through a channel, impeding current conduction through a 2DEG layer 970. This may immediately cause a problem of increasing the resistance of the channel.

Referring to FIG. 2, in order to solve the above-described problem, in an embodiment of the present disclosure, the hole injection regions 153 are formed laterally spaced apart from each other on the drain electrode 173 side. To be specific, the hole injection regions 153 may inject holes to capture electrons trapped on the side adjacent to the barrier layer 130. That is, the hole injection regions 153 inject holes into a channel to allow the holes to combine with trapped electrons, thereby lowering the electrical resistance of the device and minimizing the memory effect. In addition, the hole injection region 153 may have a lesser top and bottom thickness than the capping layer 151 or may have substantially the same thickness.

Figure 3:
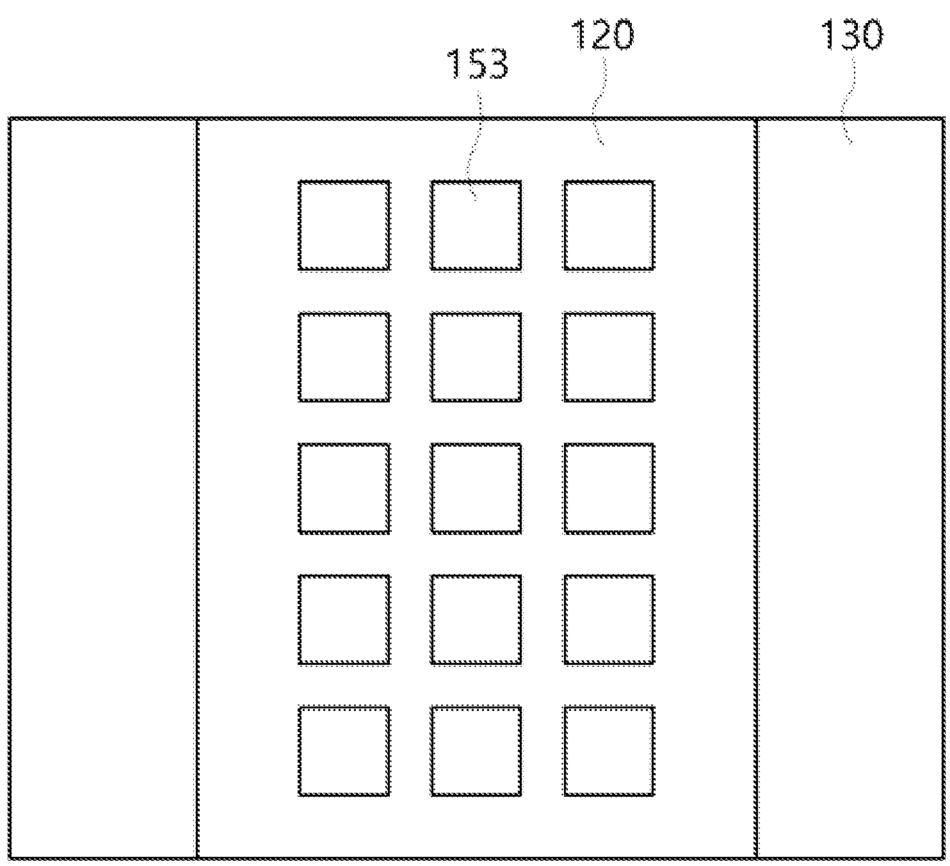
FIG. 3 is a plan view showing a hole injection region according to a first embodiment of the present disclosure.

FIG. 3 is a plan view showing a hole injection region according to a first embodiment of the present disclosure. For convenience of explanation, the insulating film and the drain electrode on the barrier layer are deleted in the attached FIG. 3.

Referring to FIG. 3, in the first embodiment, the hole injection region 153 may be provided in the form of multiple islands. When the hole injection region 153 is formed in this form, a junction area between GaN of the channel layer 120 and a metal layer such as Ti of the drain electrode 173 may be further increased.

Figure 4:
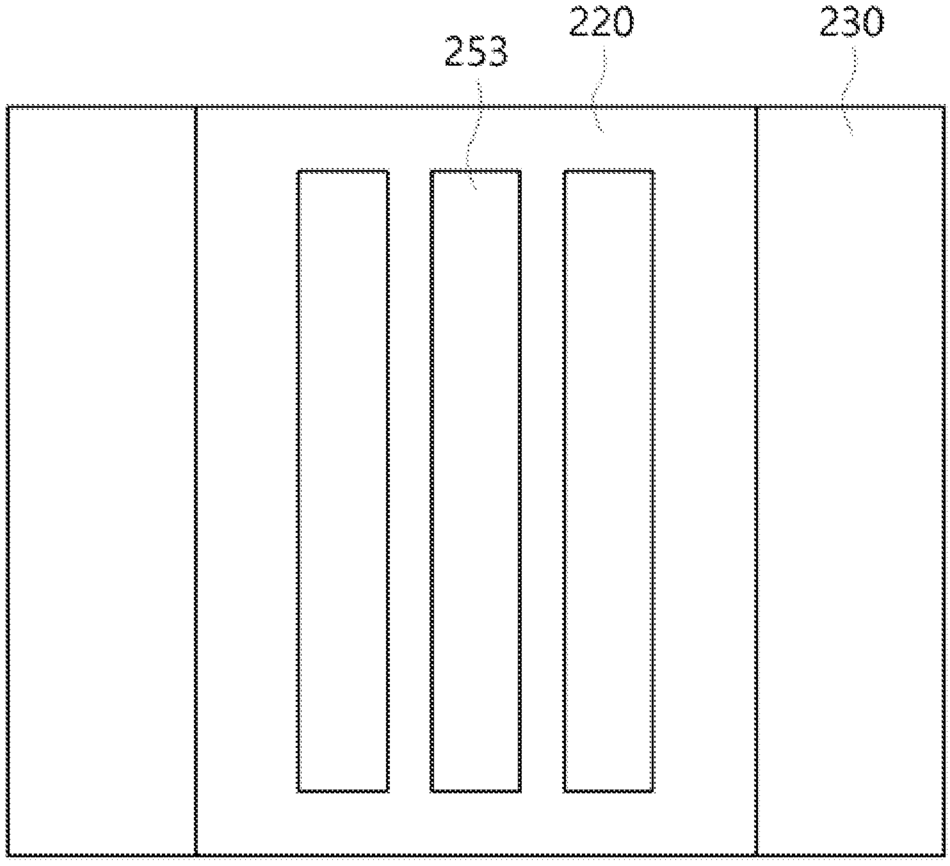
FIG. 4 is a plan view showing a hole injection region according to a second embodiment of the present disclosure.

FIG. 4 is a plan view showing a hole injection region according to a second embodiment of the present disclosure. For convenience of explanation, the insulating film and the drain electrode on the barrier layer are deleted in the attached FIG. 4.

Referring to FIG. 4, in the second embodiment, the hole injection region 253 may be provided in the form of multiple stripes spaced apart from each other along the lateral direction. Even in this case, a junction area between GaN of the channel layer 220 and a metal layer such as Ti of the drain electrode 173 may be increased.

FIGS. 5 to 15 are cross-sectional views showing a method of manufacturing a power semiconductor device according to an embodiment of the present disclosure.

Hereinafter, the method of manufacturing a power semiconductor device according to an embodiment of the present disclosure will described in detail with reference to the attached drawings.

Figure 5:
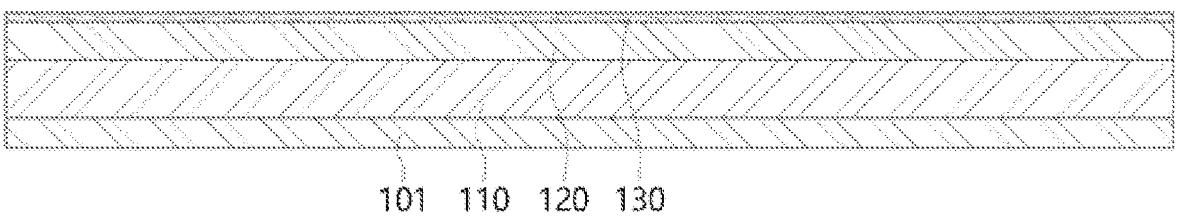
FIGS. 5 to 15 are cross-sectional views showing a method of manufacturing a power semiconductor device according to an embodiment of the present disclosure.
Figure 6:
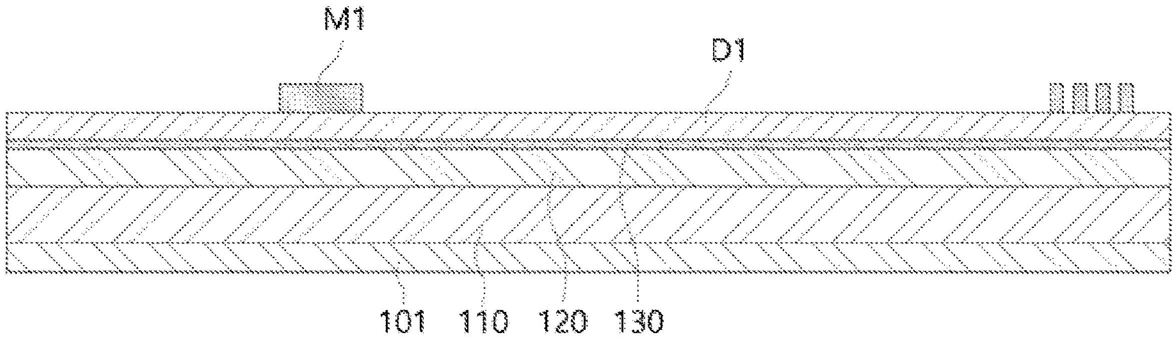
Figure 7:
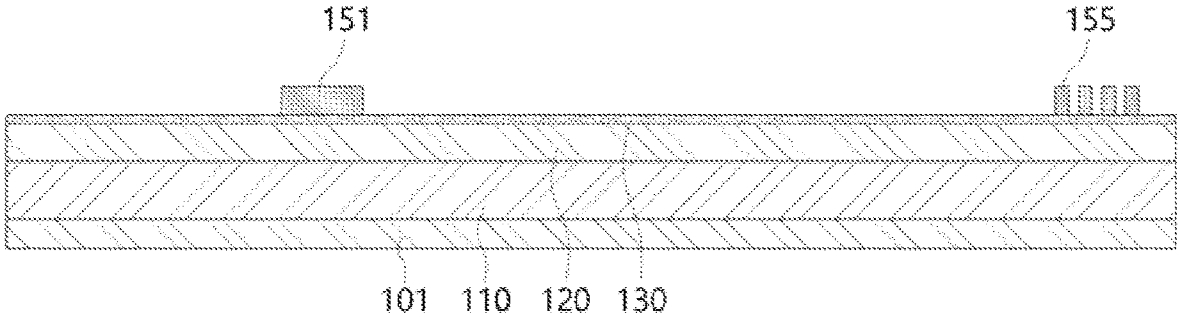

First, referring to FIG. 5, a buffer layer 110, a channel layer 120, and a barrier layer 130 are sequentially formed on a substrate 101. As previously described, the substrate 101 is a growth substrate and may be any one of a silicon substrate, a sapphire substrate, a GaN substrate, and a SiC substrate. However, in the present disclosure, the silicon substrate is used as an example. The buffer layer 110 may be formed on the substrate 101 and under the channel layer 120 by, for example, growing an AlN layer to a predetermined thickness. In addition, the channel layer 120 on the buffer layer 110 may be a nitride-based semiconductor layer such as GaN, and the barrier layer 130 on the channel layer 120 may be a semiconductor layer such as AlGaN.

A 2DEG layer (not shown) may be formed by electrons accumulating at the interface of the channel layer 120 and the barrier layer 130. To be specific, piezo polarization may occur at the interface between the channel layer 120 and the barrier layer 130 due to the difference in lattice constants between GaN and AlGaN. At this time, the piezo polarization and spontaneous polarization of the channel layer 120 and the barrier layer 130 work, and a two-dimensional electron gas with a high electron concentration may be generated at the interface of both components.

Thereafter, a capping layer 151 and a doped region 155, which is a previous stage of the hole injection region 153, may be formed on the barrier layer 130. For example, referring to FIG. 6, a doped layer D1 formed by growing GaN of the first conductivity type is formed on the barrier layer 130. Then, referring to FIGS. 6 and 7, the capping layer 151 and the doped region 155 may be formed by etching the doped layer D1 using a mask pattern M1. A plurality of doped regions 155 may be formed to be spaced apart from each other along the lateral direction.

Figure 8:
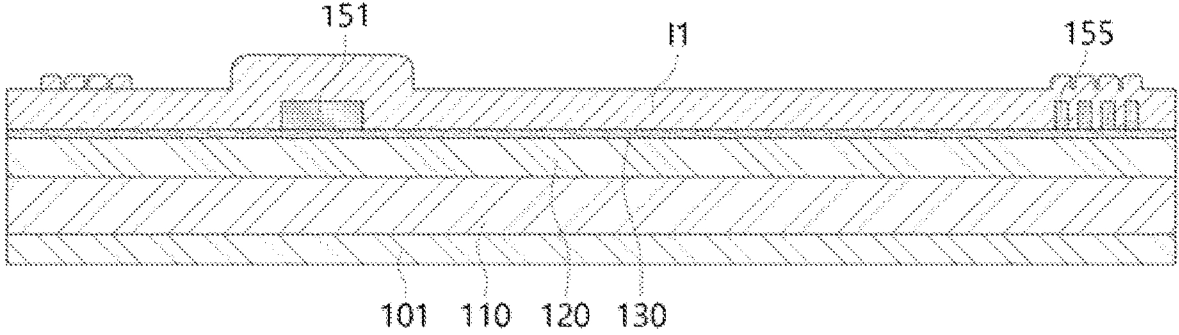
Figure 9:
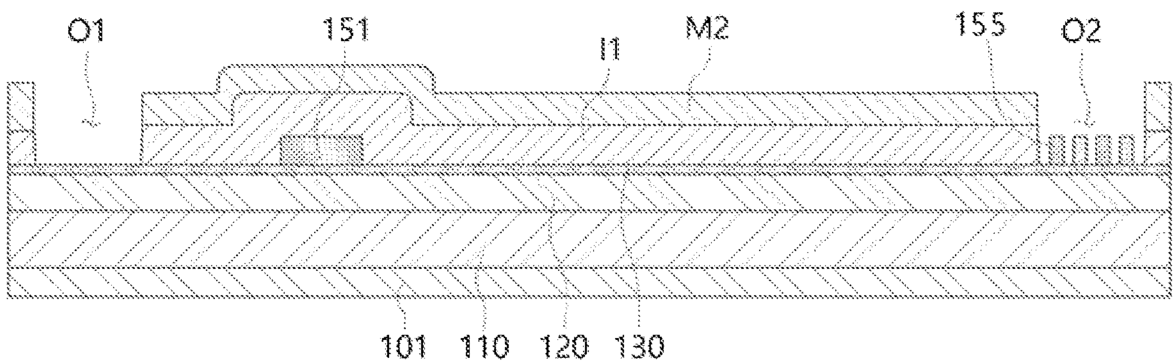

Thereafter, referring to FIG. 8, a first insulating film layer I1 may be formed to cover the capping layer 151 and the doped region 155. The first insulating film layer I1 may be formed as a multilayer film including a passivation layer 140, but the scope of the present disclosure is not limited thereto.

Thereafter, the first insulating layer I1 on the side where a source electrode 171 and a drain electrode 173 will be formed is removed or etched. For example, referring to FIG. 9, a mask pattern M2 may be formed on the first insulating film layer I1, and the first insulating film layer I1 on the side where the source electrode 171 and the drain electrode 173 will be formed may be removed. Due to this, the doped region 155 may be opened. Through this process, openings O1 and O2 may be formed on the side where the source electrode 171 and the drain electrode 173 are to be formed.

Figure 10:
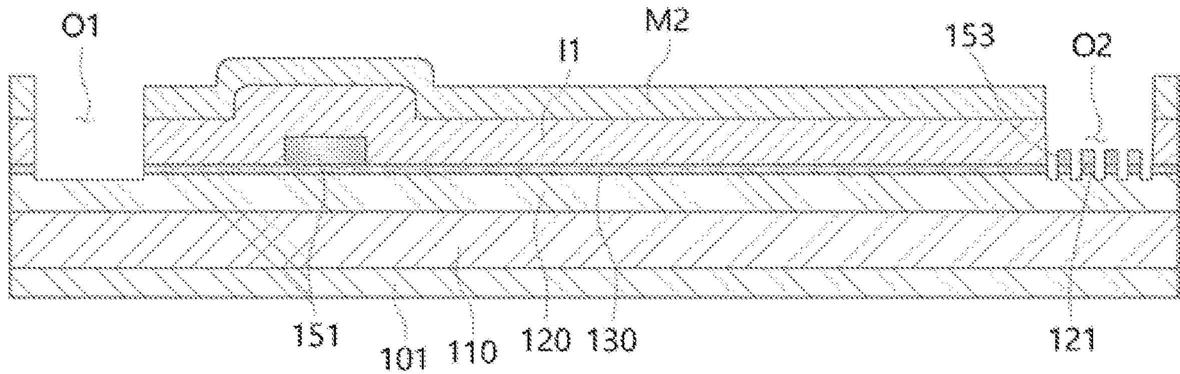
Figure 11:
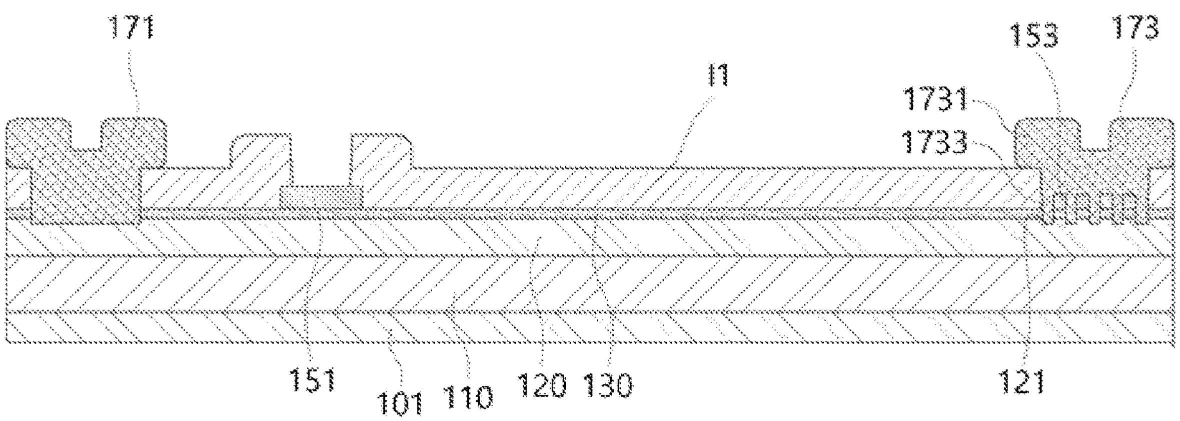
Figure 12:
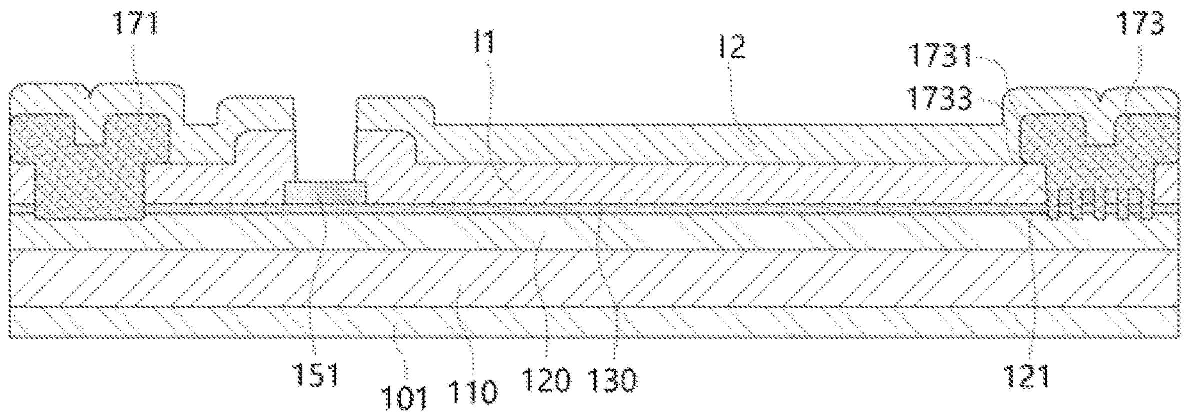
Figure 13:
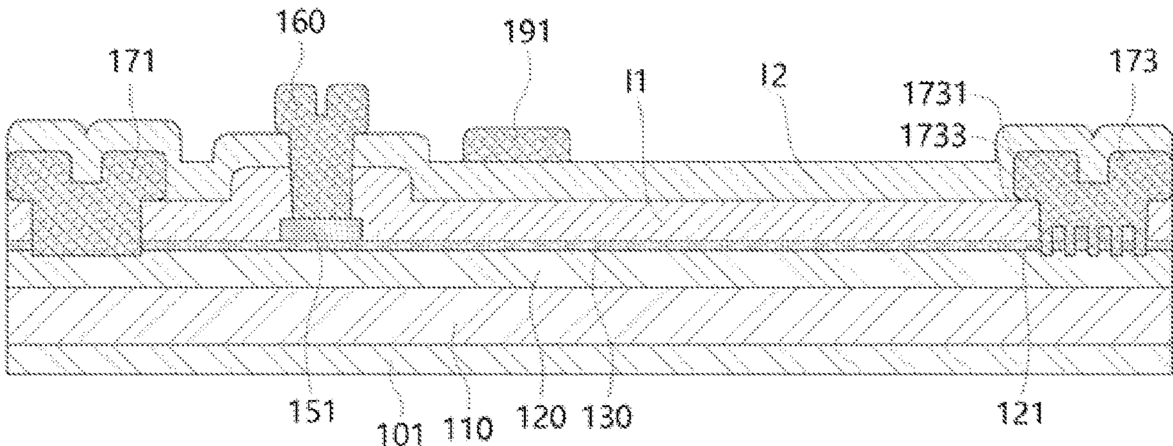

Thereafter, referring to FIG. 10, the barrier layer 130 and the channel layer 120 on the openings O1 and O2 sides are removed. To be specific, the barrier layer 130 of the opening O1 side where the source electrode 171 is formed may be removed, and the channel layer 120 may be removed to a predetermined thickness. In addition, the barrier layer 130 of the opening O2 side where the drain electrode 173 is formed may be removed, and the channel layer 120 may be removed to a predetermined thickness. A recess region 121 may be formed through this process. At this time, the barrier layer 130 and the channel layer 120 removed from the opening O2 side may be regions that do not overlap the doped region 155. In addition, in this process, the doped region 155 may also be removed to a predetermined thickness. Thus, the thickness of the doped region 155 is lesser than that of the capping layer 151, so that the hole injection region 153 may be completed. At this time, the existing second mask pattern M2 may be used. However, it should be noted that this process is not an essential step of the present disclosure.

Thereafter, the source electrode 171 and the drain electrode 173 may be formed. To illustratively explain this with reference to FIG. 11, a first conductive layer (not shown) is formed to fill the openings O1 and O2 and on the first insulating film layer I1. Then, the first conductive layer may be removed using a mask pattern (not shown) on the first conductive layer (not shown) to form the source electrode 171 and the drain electrode 173.

Thereafter, a second insulating film layer I2 may be formed on the first insulating film layer I1 to cover the source electrode 171 and the drain electrode 173. The second insulating film layer I2 may include the same material as the first insulating layer I1, or may include a different material.

Thereafter, a gate electrode 160 may be formed by partially removing the first insulating film layer I1 and the second insulating film layer I2. For example, referring to FIGS. 12 and 13, a second conductive layer (not shown) is formed on the second insulating film layer I2. Then, the second conductive layer may be removed using a mask pattern (not shown) on the second conductive layer to form the gate electrode 160. At this time, a first field plate 191 may also be formed on a side spaced apart from the gate electrode 160.

Figure 14:
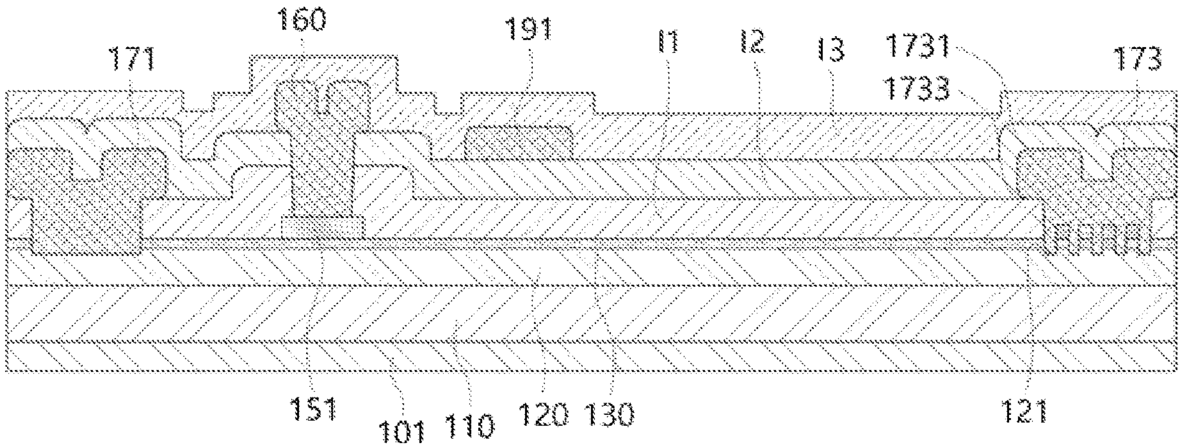

Thereafter, referring to FIG. 14, a third insulating film layer I3 may be formed on the second insulating film layer I2 to cover the gate electrode 160 and the first field plate 191.

Figure 15:
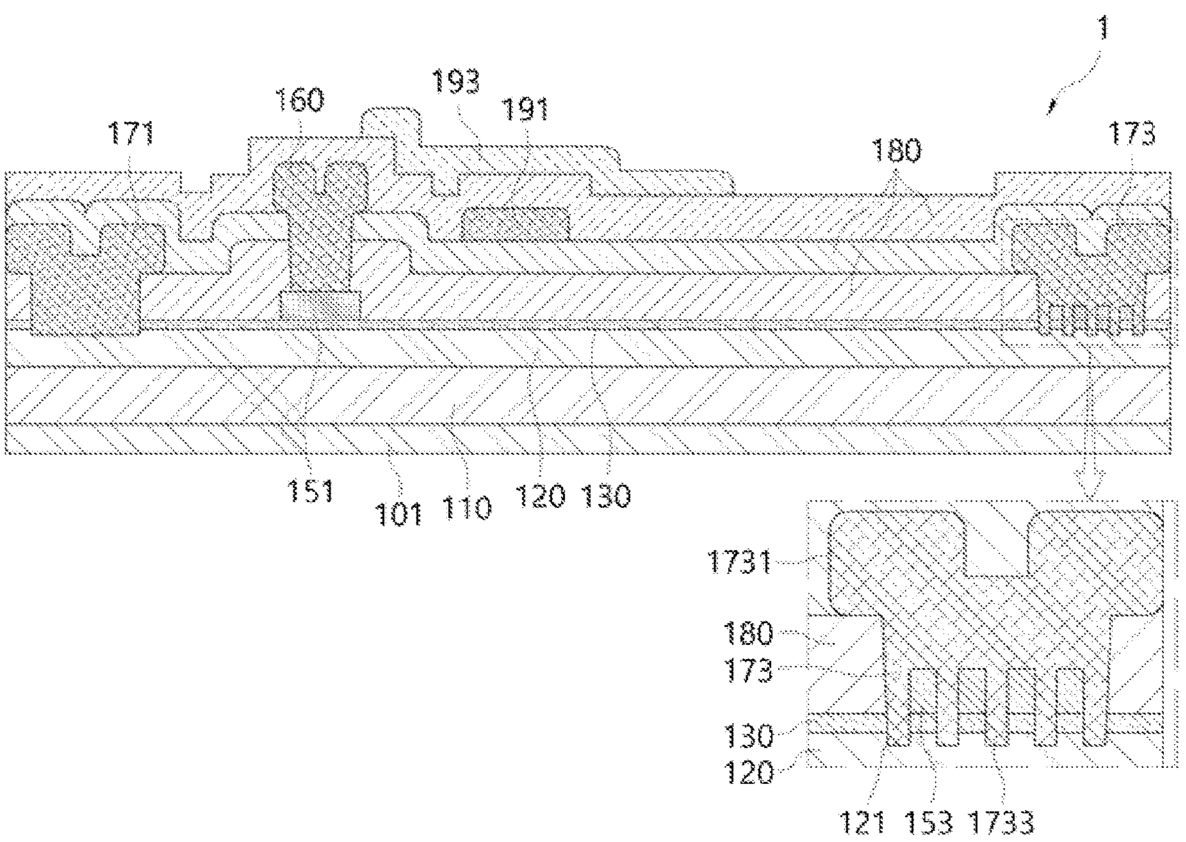

Finally, referring to FIG. 15, a second field plate 193 may be formed on the third insulating film layer I3. The second field plate 193 may be formed by forming a third conductive layer (not shown) on the third insulating film layer I3 and then removing the third conductive layer using a mask pattern (not shown).

The above detailed description is illustrative of the present disclosure. In addition, the above description shows and describes preferred embodiments of the present disclosure, and the present disclosure can be used in various other combinations, modifications, and environments. That is, changes or modifications are possible within the scope of the concept of the disclosure disclosed herein, the scope equivalent to the written disclosure, and/or within the scope of skill or knowledge in the art. The above-described embodiment describes the best state for implementing the technical idea of the present disclosure, and various changes required in the specific application field and use of the present disclosure are possible. Accordingly, the detailed description of the present disclosure is not intended to limit the present disclosure to the disclosed embodiments.

What is claimed is:

1. A power semiconductor device, comprising:

a substrate;

a channel layer having a first nitride-based semiconductor layer and disposed on the substrate;

a barrier layer disposed on the channel layer and having a second nitride-based semiconductor layer that is different from the first nitride-based semiconductor layer of the channel layer;

a capping layer having an impurity doped region of a first conductivity type and disposed on the barrier layer;

a gate electrode disposed on the capping layer;

a plurality of hole injection regions, each having an impurity doped region of a first conductivity type, each being laterally spaced apart from another on the barrier layer; and a drain electrode in contact with the plurality of hole injection regions, wherein the drain electrode comprises a plurality of protruding regions, each being disposed at a bottom of the drain electrode in a space between the plurality of hole injection regions, and wherein an upper surface of the channel layer below each of the plurality of hole injection regions is disposed at a higher position than an upper surface of the channel layer below each of the plurality of protruding regions.

2. The power semiconductor device of claim 1, wherein the plurality of protruding regions have bottoms thereof extending into the channel layer.

3. The power semiconductor device of claim 1, wherein the capping layer has a greater top to bottom thickness compared to a top to bottom thickness of each of the plurality of hole injection regions.

4. The power semiconductor device of claim 1, wherein the plurality of hole injection regions are spaced apart from each other in an island pattern.

5. The power semiconductor device of claim 1, wherein the plurality of hole injection regions are laterally spaced from each other in a stripe pattern.

6. The power semiconductor device of claim 1, wherein the drain electrode further comprises a wing portion that protrudes a predetermined length from a predetermined height of the drain electrode toward a side adjacent to the gate electrode.

7. The power semiconductor device of claim 1, further comprising:

an insulating film covering the gate electrode and the drain electrode; and a first field plate disposed apart from the gate electrode within the insulating film, wherein the first field plate is electrically connected to the gate electrode.

8. The power semiconductor device of claim 1, further comprising:

a source electrode disposed apart from the gate electrode; and a second field plate disposed apart from the gate electrode within an insulating film, wherein the second field plate is electrically connected to the source electrode.

9. A power semiconductor device, comprising:

a substrate;

a channel layer having a first nitride-based semiconductor layer and disposed on the substrate;

a barrier layer disposed on the channel layer and having a second nitride-based semiconductor layer that is different from the first nitride-based semiconductor layer of the channel layer;

a capping layer having an impurity doped region of a first conductivity type and disposed on the barrier layer;

a gate electrode disposed on the capping layer;

a plurality of hole injection regions, each having an impurity doped region of a first conductivity type and laterally disposed apart from another on the barrier layer;

a source electrode disposed apart from the gate electrode; and a drain electrode disposed apart from the gate electrode and including a plurality of protruding regions, each being disposed in a space between the plurality of hole injection regions, wherein an upper surface of the channel layer below each of the plurality of hole injection regions is disposed at a higher position than an upper surface of the channel layer below each of the plurality of protruding regions.

10. The power semiconductor device of claim 9, wherein the capping layer has a thickness that is substantially the same as a thickness of each of the plurality of hole injection regions.

11. The power semiconductor device of claim 9, further comprising:

an insulating film covering the gate electrode, the source electrode, and the drain electrode;

a first field plate disposed apart from the gate electrode within the insulating film; and a second field plate disposed apart from the first field plate within the insulating film, wherein the first field plate is electrically connected to the gate electrode and the second field plate is electrically connected to the source electrode.

12. The power semiconductor device of claim 9, wherein each of the plurality of protruding regions has a longer vertical length than a vertical length of each of the plurality of hole injection regions adjacent thereto.

13. A method of manufacturing a power semiconductor device, the method comprising:

forming a channel layer having a first nitride-based semiconductor layer on a substrate;

forming a barrier layer having a second nitride-based semiconductor layer that is different from the first nitride-based semiconductor layer on the channel layer;

forming a capping layer of a first conductivity type on the barrier layer;

forming a plurality of hole injection regions on the barrier layer apart from the capping layer;

forming a first insulating film layer on the barrier layer to cover the capping layer and the plurality of hole injection regions; and forming a source electrode and a drain electrode after etching the first insulating film layer.

14. The method of claim 13, wherein the plurality of hole injection regions are provided to be spaced apart from each other by forming a first doped layer on the barrier layer and then etching the first doped layer using a mask pattern.

15. The method of claim 14, wherein the drain electrode is provided by:

forming a plurality of trenches by etching the barrier layer and the channel layer beneath a plurality of spaces separating the plurality of hole injection regions from each other, forming a doped layer of a first conductivity type to cover the plurality of hole injection regions and fill the plurality of trenches, and etching the doped layer.

16. The method of claim 14, wherein each of the plurality of hole injection regions has a lesser thickness than a thickness of the capping layer.

17. The method of claim 14, further comprising:

forming a gate electrode on the capping layer;

forming a first field plate apart from the gate electrode; and forming a second field plate above and apart from the first field plate.

* * * * *